US012581709B2

(12) United States Patent
Jeong et al.

(10) Patent No.: US 12,581,709 B2
(45) Date of Patent: Mar. 17, 2026

(54) TELLURIUM OXIDE, AND THIN FILM TRANSISTOR COMPRISING SAME AS CHANNEL LAYER

(71) Applicant: Samsung Electronics Co., Ltd., Suwon-si (KR)

(72) Inventors: Jae Kyeong Jeong, Seoul (KR); Tai Kyu Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 634 days.

(21) Appl. No.: 17/800,654

(22) PCT Filed: Jun. 19, 2020

(86) PCT No.: PCT/KR2020/007953
§ 371 (c)(1),
(2) Date: Aug. 18, 2022

(87) PCT Pub. No.: WO2021/172665
PCT Pub. Date: Sep. 2, 2021

(65) Prior Publication Data
US 2023/0352539 A1     Nov. 2, 2023

(30) Foreign Application Priority Data

Feb. 28, 2020     (KR) ........................ 10-2020-0025463

(51) Int. Cl.
*H10D 62/84*     (2025.01)
*H10D 30/67*     (2025.01)
*H10D 99/00*     (2025.01)

(52) U.S. Cl.
CPC ......... *H10D 62/84* (2025.01); *H10D 30/6755* (2025.01); *H10D 99/00* (2025.01)

(58) Field of Classification Search
CPC .... H10D 30/6755; H10D 62/84; H10D 99/00; H01L 21/02521; H01L 21/02595;
(Continued)

(56) References Cited

U.S. PATENT DOCUMENTS

2007/0077691 A1     4/2007   Watanabe
2007/0254455 A1     11/2007   Yamaguchi et al.
(Continued)

FOREIGN PATENT DOCUMENTS

CN         1938853 A      3/2007
CN       101064287 A     10/2007
(Continued)

OTHER PUBLICATIONS

"Controlling the Pd Metal Contact Polarity to Trigonal Tellurium by Atomic Hydrogen-Removal of the Native Tellurium Oxide." Advanced Materials Interfaces 2021, 8, 2002050 pp. 1-6. (Year: 2021).*
(Continued)

*Primary Examiner* — Brigitte A Paterson
(74) *Attorney, Agent, or Firm* — Harness, Dickey & Pierce, P.L.C.

(57) ABSTRACT

Tellurium oxide and a thin film transistor comprising the same as a channel layer are provided. The tellurium oxide is a metal oxide including tellurium, wherein a portion of the tellurium is in a $Te^0$ state having a zero oxidation number, and another portion of the tellurium is in a $Te^{4+}$ state having a tetravalent oxidation number.

19 Claims, 5 Drawing Sheets

(58) Field of Classification Search
CPC .......... H01L 21/0262; H01L 21/02664; H01L 21/02488; H01L 21/02579; H01L 21/02581; H01L 21/02565
See application file for complete search history.

(56) References Cited

U.S. PATENT DOCUMENTS

| | | | |
|---|---|---|---|
| 2008/0123396 A1 | 5/2008 | Kato et al. | |
| 2008/0156651 A1 | 7/2008 | Kang et al. | |
| 2010/0009078 A1 | 1/2010 | Pore et al. | |
| 2010/0123128 A1 | 5/2010 | Jeon et al. | |
| 2012/0049183 A1 | 3/2012 | Yamazaki | |
| 2017/0236971 A1 | 8/2017 | ElAnzeery et al. | |
| 2019/0067005 A1 | 2/2019 | Yun et al. | |
| 2019/0393353 A1 | 12/2019 | Jeong et al. | |

FOREIGN PATENT DOCUMENTS

| | | |
|---|---|---|
| CN | 101222020 A | 7/2008 |
| CN | 102076882 A | 5/2011 |
| CN | 110634882 A | 12/2019 |
| JP | 2007-059890 A | 3/2007 |
| JP | 2013-229292 A | 11/2013 |
| KR | 10-2007-0086022 A | 8/2007 |
| KR | 10-2012-0132998 A | 12/2012 |
| KR | 10-2017-0098053 A | 8/2017 |
| KR | 10-2017-0122380 A | 11/2017 |
| KR | 10-2018-0001603 A | 1/2018 |
| KR | 10-2024229 B1 | 9/2019 |

OTHER PUBLICATIONS

Fatemeh Arab, et al, "Synthesis, characterization, and optical properties of Te, Te/TeO2 and TeO2 nanostructures via a one-pot hydrothermal method", RSC Advances, Jul. 15, 2016, pp. 71472-71480.

International Search Report for PCT/KR2020/007953 dated Nov. 25, 2020.

European Search Report dated Dec. 22, 2023 issued in corresponding European Appln. No. 20921434.5.

Kawaguchi, T. et al. "A Novel Method of Fabricating Te Thin-Film Transistors." Japanese Journal of Applied Physics 25:3 (1986): pp. 449-452.

Arab, F. et al. "Facile sonochemical synthesis of tellurium and tellurium dioxide nanoparticles: Reducing Te(IV) to Te via ultrasonic irradiation in methoanol." Ultrasonics Sonochemistry 37 (2017): pp. 335-343.

Chinese Office Action dated Feb. 28, 2025 issued in Chinese Patent Application No. 202080097656.3.

* cited by examiner

TELLURIUM OXIDE, AND THIN FILM TRANSISTOR COMPRISING SAME AS CHANNEL LAYER

CROSS REFERENCE TO RELATED APPLICATIONS

This application is a National Stage of International Application No. PCT/KR2020/007953 filed Jun. 19, 2020, claiming priority based on Korean Patent Application No. 10-2020-0025463 filed Feb. 28, 2020.

TECHNICAL FIELD

The present invention relates to a semiconductor device, and more particularly, to a transistor having an oxide semiconductor layer.

BACKGROUND ART

After the invention of a thin film transistor (hereinafter referred to as TFT) using amorphous silicon, display technology using the same has rapidly developed. These amorphous silicon TFTs were mainly used in flat panel displays because they can be formed in a large area at a low price.

Recently, TFTs using IGZO (In—Ga—Zn—O) or ZnO oxide semiconductors have been developed. These oxide semiconductors can mainly implement n-type semiconductors with electron conductivity, but it is difficult to implement p-type semiconductors with hole conductivity. Although some p-type oxide semiconductors have been developed, the use of TFTs using them is extremely limited due to low on/off current ratio and mobility.

DISCLOSURE

Technical Problem

The problem to be solved by the present invention is to provide a hole conductive oxide semiconductor and a thin film transistor having the same.

The technical problems of the present invention are not limited to the technical problems mentioned above, and other technical problems not mentioned will be clearly understood by those skilled in the art from the following description.

Technical Solution

In order to achieve the above object, an aspect of the present invention provides tellurium oxide. The tellurium oxide is a metal oxide including tellurium, and a portion of the tellurium is in a $Te^0$ state having a zero oxidation number, and another portion of the tellurium is in a $Te^{4+}$ state having a tetravalent oxidation number.

In an example, 30 to 90% of $Te^0$, and 10 to 70% of $Te^{4+}$ may be contained. In an example, the content of $Te^0$ may be greater than that of $Te^{4+}$.

The tellurium oxide may be crystalline. The tellurium oxide may be polycrystalline. The tellurium oxide may be a p-type semiconductor. In the tellurium oxide, the energy level of the valence band maximum may be composed of Te 5p orbital.

A metal having a positive oxidation number may be doped into the tellurium oxide or added into the tellurium oxide for forming an alloy. A non-metal element having a negative oxidation number may be doped into the tellurium oxide or added into the tellurium oxide for forming an alloy.

The tellurium oxide may be represented by the following Formula 1.

$$Te_{1-a}M_aO_{x-b}A_b \qquad \text{[Formula 1]}$$

In Formula 1, x may be greater than 0 and less than 2, M may be a metal having a positive oxidation number, $0 \le a \le 0.5$, A may be an element having a negative oxidation number, and $0 \le b \le 1$. In one example, x may be between 0.2 and 1.2.

In order to achieve the above object, an aspect of the present invention provides a tellurium oxide semiconductor. The tellurium oxide semiconductor includes metallic Te and $TeO_2$, and the energy level of the valence band maximum is composed of Te 5p orbital. The metallic Te may be contained in an amount of 30 to 90%, and $TeO_2$ may be contained in an amount of 10 to 70%. The metallic Te may be contained in a greater number of moles than $TeO_2$.

In order to achieve the above object, an aspect of the present invention provides a method for manufacturing a tellurium oxide semiconductor layer. First, a tellurium oxide layer is deposited on a substrate. The deposited tellurium oxide layer is heat treated to form the tellurium oxide semiconductor layer in which a part of Te is in a $Te^0$ state having a zero oxidation number, and another part of Te is in a $Te^{4+}$ state having a tetravalent oxidation number.

In the heat treatment process, the $Te^0$ content in the tellurium oxide layer may decrease and the $Te^{4+}$ content may increase. A passivation layer covering the surface of the heat-treated tellurium oxide layer may be formed. The passivation layer may be a metal oxide insulating layer or a metal layer. The passivation layer may be an $Al_2O_3$ layer.

In order to achieve the above object, an aspect of the present invention provides a thin film transistor. The thin film transistor has a gate electrode. A tellurium oxide channel layer containing the tellurium oxide is disposed on or under the gate electrode. A gate insulating layer is disposed between the gate electrode and the tellurium oxide channel layer. A source electrode and a drain electrode are electrically connected to both ends of the tellurium oxide channel layer, respectively.

The gate insulating layer may be a high-k insulating layer having a higher dielectric constant than that of a silicon oxide layer. The tellurium oxide channel layer may be exposed between the source electrode and the drain electrode, and a passivation layer may be disposed between the source electrode and the drain electrode to cover a surface of the exposed tellurium oxide channel layer. The passivation layer may be an $Al_2O_3$ layer. A first interfacial layer for alleviating Fermi-level pinning between the tellurium oxide channel layer and the gate insulating layer and/or a second interfacial layer for alleviating Fermi-level pinning between the tellurium oxide channel layer and the source/drain electrodes may be disposed.

Advantageous Effects

According to embodiments of the present invention, it is possible to provide a hole conductive oxide semiconductor and a thin film transistor having the same.

However, the effects of the present invention are not limited to the above-mentioned effects, and other effects not mentioned will be clearly understood by those skilled in the art from the following description.

MODES OF THE INVENTION

Figure 1:
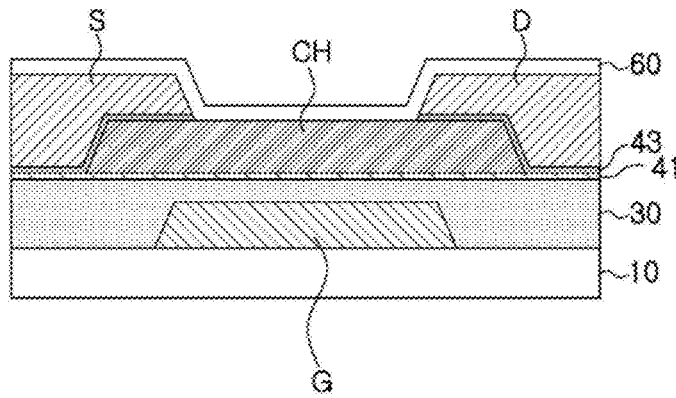
FIG. 1 is a cross-sectional view showing a thin film transistor according to an embodiment of the present invention.

Hereinafter, preferred embodiments according to the present invention will be described in more detail with reference to the accompanying drawings in order to describe the present invention in more detail. However, the present invention is not limited to the embodiments described herein and may be embodied in other forms. In the drawings, when a layer is referred to as being "on" another layer or substrate, it may be formed directly on the other layer or substrate, or a third layer may be interposed therebetween. In the present embodiments, "first", "second", or "third" is not intended to impose any limitation on the components, but should be understood as terms for distinguishing the components.

Tellurium Oxide Semiconductor

The tellurium oxide layer according to an embodiment of the present invention is a metal oxide layer containing tellurium and may have hole conductivity, that is, a P-type semiconductor layer. In the tellurium oxide layer, some of the tellurium may be in an unoxidized state, that is, a state having an oxidation number of 0, that is, a metallic Te ($Te^0$) state. In addition, another portion of the tellurium in the tellurium oxide layer may be in a state having an oxidation number of 4+, that is, $Te^{4+}$. In an example, in the tellurium oxide layer, tellurium may have only a metallic Te state and a $Te^{4+}$ state. In one example, $Te^0$ may be contained in an amount of 30 to 90%, and $Te^{4+}$ may be contained in an amount of 10 to 70%. Specifically, $Te^0$ may be contained in an amount of 35 to 85% or 40 to 80%, and $Te^{4+}$ may be contained in an amount of 15 to 65% or 20 to 60%. In another example, the content of $Te^0$ may be greater than that of $Te^{4+}$.

The tellurium oxide may contain metallic Te, that is, $Te^0$ and $TeO_2$. In this case, the metallic Te may be contained in an amount of 30 to 90%, and $TeO_2$ may be contained in an amount of 10 to 70%. Specifically, the metallic Te may be contained in an amount of 35 to 85% or 40 to 80%, and $TeO_2$ may be contained in an amount of 15 to 65% or 20 to 60%.

In one example, metallic Te may be contained in a greater number of moles than $TeO_2$ in the tellurium oxide.

In an example, one or more metals having an oxidation number of +2, +3, or +4 as an example of a metal in a positive oxidation state may be added to the tellurium oxide, wherein the tellurium oxide may be doped with the metal in a positive oxidation state or added with the metal in a positive oxidation state to form an alloy. In tellurium oxide to which the metal in a positive oxidation state is added, the density of holes can be controlled. The metal in the positive oxidation state may substitute a portion of the tellurium in the tellurium oxide. In an example, an element having a negative oxidation number may be doped into the tellurium oxide or added to the tellurium oxide to form an alloy. The element having a negative oxidation number may substitute a part of oxygen.

The energy level of the valence band maximum of the tellurium oxide may be composed of a 5p orbital originating from the $Te^0$ state, and the tellurium oxide may provide higher hole mobility than conventionally known p-type oxide semiconductors having a valence band maximum energy level composed of 2p orbitals of oxygen.

The tellurium oxide may be in an amorphous state or a crystalline state. Furthermore, the tellurium oxide may be in a polycrystalline state or a single crystal state as an example of the crystalline state.

The tellurium oxide may be represented by the following Formula 1.

$$Te_{1-a}M_aO_{x-b}A_b \qquad \text{[Formula 1]}$$

In Formula 1, a portion of Te may be in a state having an oxidation number of 0 ($Te^0$), and another portion of Te may be in a state of $Te^{4+}$ having an oxidation number of +4. In one example, $Te^0$ may be contained in a greater amount compared to $Te^{4+}$. In other words, the tellurium oxide may be a mixture of metallic Te, that is, $Te^0$ and $TeO_2$. In one example, $Te^0$ may be contained in a greater number of moles than $TeO_2$ in the tellurium oxide.

The x may be greater than 0 and less than 2, specifically 0.1 to 1.8, more specifically 0.2 to 1.2, for example, may have a value of 0.25 to 1.1 or 0.3 to 1.

In Formula 1, M may be one or more metals having a positive oxidation number, for example, a metal having an oxidation number of +2, +3, or +4 or a combination thereof, and $0 \le a \le 0.5$. As an example, M may be Sn, Al, Sb, Hf, La, Y, Zr, Zn, or a combination thereof. In tellurium oxide to which M is added, the density of holes can be controlled.

In Formula 1, A may be one or more elements having a negative oxidation number, and may be a non-metal element having an oxidation number of −1 or −2 or a combination thereof, and $0 \le b \le 1$. As an example, A may be F, Cl, Br, I, S, Se, or a combination thereof.

The tellurium oxide semiconductor layer may be formed by depositing a tellurium oxide layer on a substrate and then heat-treating the deposited tellurium oxide layer.

The tellurium oxide layer may be in an amorphous state in an as-deposited state. The tellurium oxide layer may be formed using various methods used in the art, and specifically, it may be formed using a physical vapor deposition method such as sputtering or a chemical deposition method such as a chemical vapor deposition method or an atomic layer deposition method. In one embodiment, the tellurium oxide layer may be formed using a sputtering method using a Te target in an oxygen atmosphere. When a in Formula 1 exceeds 0, a sputtering method using a target of a corresponding metal may be additionally used when depositing the tellurium oxide layer. In addition, when b exceeds 0 in the above formula, when depositing the tellurium oxide layer, a corresponding gas may be contained in the atmosphere.

The heat treatment may be performed at a temperature of about 20 to 300° C., for example, about 50 to 250° C., specifically, 100 to 230° C. in an atmospheric, oxygen, or vacuum atmosphere. In the heat treatment process, the $Te^0$ content in the tellurium oxide layer may decrease and the $Te^{4+}$ content may increase. In addition, the heat-treated tellurium oxide layer may be crystallized.

A passivation layer covering the surface of the heat-treated tellurium oxide layer may be formed. In this case, the crystallinity of the tellurium oxide layer may be further improved. The passivation layer may be a metal oxide insulating film such as $Al_2O_3$, $HfO_2$, $ZrO_2$, or a metal film such as Ta, Ti, Al, or Zn. In this case, the metal in the passivation layer may be diffused into the tellurium oxide layer by heat applied during the process of forming the passivation layer, thereby helping crystallization.

The tellurium oxide semiconductor layer may be used as a channel layer of a thin film transistor which will be described later, a channel layer of a phototransistor, an active layer of a photodetector, an active layer of a gas sensor, etc., but is not limited thereto.

p-Type Thin Film Transistor

FIG. 1 is a cross-sectional view showing a thin film transistor according to an embodiment of the present invention.

Referring to FIG. 1, a substrate 10 may be provided. The substrate 10 may be a semiconductor, metal, glass or polymer substrate. A gate electrode G extending in one direction may be formed on the substrate 10. The gate electrode G may be formed using Al, Cr, Cu, Ta, Ti, Mo, W, or an alloy thereof. A gate insulating layer 30 may be formed on the gate electrode G. The gate insulating layer 30 may be a silicon oxide layer, for example a $SiO_2$ layer, a silicon oxynitride layer (SiON), an aluminum oxynitride layer, a high-k insulating layer having a higher dielectric constant compared to a silicon oxide layer, or a composite layer thereof. The gate insulating layer 30 may be a high-k insulating layer having a higher dielectric constant compared to a silicon oxide layer, for example $Al_2O_3$, $HfO_2$, or $ZrO_2$. In this case, the driving voltage of the thin film transistor can be reduced.

A tellurium oxide channel layer CH disposed to overlap the gate electrode 20 on the gate electrode 20 may be formed on the gate insulating layer 30. The tellurium oxide channel layer CH is the above-described tellurium oxide layer, and may be a p-type oxide semiconductor having hole conductivity. The tellurium oxide channel layer (CH) may be a semiconductor layer represented by Formula 1 above.

The tellurium oxide channel layer CH may be in an amorphous state in an as-deposited state. The tellurium oxide channel layer (CH) may be formed using various methods used in the art, and specifically, a physical vapor deposition method such as sputtering or a chemical deposition method, such as a chemical vapor deposition method, an atomic layer deposition method. In one embodiment, the tellurium oxide channel layer (CH) may be formed using a sputtering method using a Te target in an oxygen atmosphere. In addition, the tellurium oxide channel layer (CH) may be patterned using various methods used in the art. The tellurium oxide channel layer (CH) may have a thickness of several to several tens of nm, for example, 2 to 20 nm, for example, 5 to 10 nm.

A source electrode (S) and a drain electrode (D) may be formed on both ends of the tellurium oxide channel layer (CH), and a partial surface of the tellurium oxide channel layer (CH) may be exposed between the source electrode (S) and the drain electrode (D). The source electrode S and the drain electrode D may be formed using at least one metal of aluminum (Al), neodymium (Nd), silver (Ag), chromium (Cr), titanium (Ti), tantalum (Ta), and molybdenum (Mo) or an alloy containing one of them, or a metal oxide conductive film such as Indium Tin Oxide (ITO).

The substrate on which the source/drain electrodes S and D are formed may be heat-treated. The heat treatment may be performed at a temperature of about 20 to 300° C., for example, about 50 to 250° C., specifically, 100 to 230° C. in an atmospheric, oxygen, or vacuum atmosphere. During the heat treatment process, the $Te^0$ content in the tellurium oxide channel layer CH may decrease and the $Te^{4+}$ content may increase. In addition, the heat-treated tellurium oxide channel layer CH may be crystallized. Also, an ohmic junction between the source/drain electrodes S and D and the metal oxide channel layer CH may be improved during the heat treatment process.

A passivation layer 60 covering the exposed surface of the tellurium oxide channel layer CH may be formed between the source electrode S and the drain electrode D. When the passivation layer 60 is formed, the crystallinity of the tellurium oxide channel layer CH may be further improved. The passivation film 60 may be a metal oxide insulating film such as $Al_2O_3$, $HfO_2$, $ZrO_2$, or a metal film such as Ta, Ti, Al, or Zn. In this case, the metal in the passivation layer 60 may be diffused into the tellurium oxide channel layer CH by heat applied in the process of forming the passivation layer 60, thereby helping crystallization. When the passivation film 60 is a metal film, the formed passivation film 60 may be removed.

The thin film transistor may further include a lower interface layer 41 positioned between the tellurium oxide channel layer CH and the gate insulating layer 30 and/or an upper interfacial layer 43 positioned between the tellurium oxide channel layer CH and the source/drain electrodes S and D. The lower interfacial layer 41 may be formed on the gate insulating layer 30 before forming the tellurium oxide channel layer CH, and the upper interfacial layer 43 may be formed on the tellurium oxide channel layer CH before forming the source/drain electrodes S and D. When the upper interfacial layer 43 is formed, the upper interfacial layer 43 on the tellurium oxide channel layer CH may be exposed between the source/drain electrodes S and D. In this case, the passivation insulating layer 60 may be formed in contact with the upper interface layer 43.

The lower interfacial layer 41 may alleviate Fermi-level pinning that may occur at the interface between the tellurium oxide channel layer CH and the gate insulating layer 30, and the upper interfacial layer 43 may alleviate Fermi-level pinning that may occur at the interface between the tellurium oxide channel layer CH and the source/drain electrodes S and D. The lower interfacial layer 41 and the upper interfacial layer 43 may be ZnO, $TiO_2$, $Al_2O_3$, $HfO_2$, or $ZrO_2$ regardless of each other. However, the upper interface layer 43 may have a thickness that is thin enough to enable charge tunneling between the tellurium oxide channel layer CH and the source/drain electrodes S and D. For example, the upper interface layer 43 may have a thickness of several nm.

The thin film transistor illustrated in FIG. 1 has a bottom gate/top contact structure, but is not limited thereto, and a thin film transistor having a bottom gate/bottom contact structure, a top gate/top contact structure, or a top gate/bottom contact structure may also be implemented. In the top gate structure, the tellurium oxide channel layer is disposed to overlap the gate electrode under the gate electrode, and in the bottom contact structure, the source/drain electrodes are positioned under the tellurium oxide channel layer and may be electrically connected to the tellurium oxide channel layer.

The p-type thin film transistor may constitute an inverter as an example of a complementary TFT circuit together with an n-type thin film transistor. In this case, the n-type thin film mask was placed on the $SiO_2$ layer, and a $TeO_x$ pattern of about 5 nm was deposited as a semiconductor layer through sputtering using a Te target while oxygen as a reaction gas and argon as a carrier gas were supplied into a chamber. A shadow mask was placed on the $TeO_x$ pattern, and an electrode pattern was deposited using sputtering in an Ar atmosphere to form source/drain electrodes on both ends of the $TeO_x$ pattern.

Preparation Examples 2 to 7

Thin film transistors were manufactured using the same method as in Preparation Example 1, except that the $TeO_x$ layer was heat-treated at the temperature shown in Table 1 below in an atmospheric atmosphere for 1 hour after forming the source/drain electrodes.

Table 1 below shows the composition of the $TeO_x$ pattern thin film during the manufacturing process of the TFT according to Preparation Examples 1 to 7. The composition of the $TeO_x$ pattern thin film was measured using X-ray photoelectron spectroscopy (XPS).

TABLE 1

| | heat treatment temp. | $TeO_x$ composition (at %) | | x value in $TeO_x$ | $Te^{4+}$ and $Te^0$ ratio (%) | | TFT Characteristics on/off ratio | mobility $(cm^2/Vs)$ |
|---|---|---|---|---|---|---|---|---|
| | | Te | O | | $Te^{4+}$ | $Te^0$ | | |
| Preparation Example 1 | — | 81.0 | 19.0 | 0.2 | 9.9 | 90.1 | $6.7 \times 10^2$ | 5 |
| Preparation Example 2 | 50° C. | 79.5 | 20.5 | 0.3 | 13.2 | 86.8 | $1.6 \times 10^3$ | 33 |
| Preparation Example 3 | 100° C. | 71.7 | 38.3 | 0.5 | 23.1 | 76.9 | $9.0 \times 10^3$ | 38 |
| Preparation Example 4 | 150° C. | 61.9 | 38.1 | 0.6 | 37.1 | 62.9 | $1.4 \times 10^4$ | 48 |
| Preparation Example 5 | 200° C. | 49.3 | 50.7 | 1.0 | 64.2 | 35.8 | $1.0 \times 10^4$ | 24 |
| Preparation Example 6 | 250° C. | 45.3 | 54.7 | 1.2 | 68.4 | 31.6 | $6.5 \times 10^3$ | 10 |
| Preparation Example 7 | 300° C. | 32.4 | 67.6 | 2.1 | 98.1 | 1.9 | — | — | transistor may include an n-type oxide semiconductor as a channel layer, and the n-type oxide semiconductor may be ZnO, IZO (InZnO), IGO (InGaO), or IGZO (InGaZnO), but is not limited thereto.

In addition, the p-type thin film transistor may be used as a switching device electrically connected to a pixel electrode of an organic light emitting diode (OLED) or liquid crystal display, or may be used as a switching element electrically connected to one electrode of a memory device, for example, a resistance change memory (RRAM), a phase change RAM (PRAM), or a magnetic RAM (MRAM). However, the present invention is not limited thereto.

Hereinafter, a preferred example is presented to help the understanding of the present invention. However, the following examples are only for helping understanding of the present invention, and the present invention is not limited by the following examples.

Preparation Example 1

A 100 nm $SiO_2$ layer, which is a gate insulating film, was grown on the p-type Si wafer by thermally oxidizing the p-type Si wafer serving as the gate electrode. A shadow Referring to Table 1, it can be seen that as the heat treatment temperature increases, the content of Te present in the thin film decreases and the content of O increases. Meanwhile, it can be seen that when the heat treatment is performed at a temperature of more than 250° C. or 300° C. or more, the content of Te is rapidly reduced, which is estimated because Te is volatilized.

Figure 2:
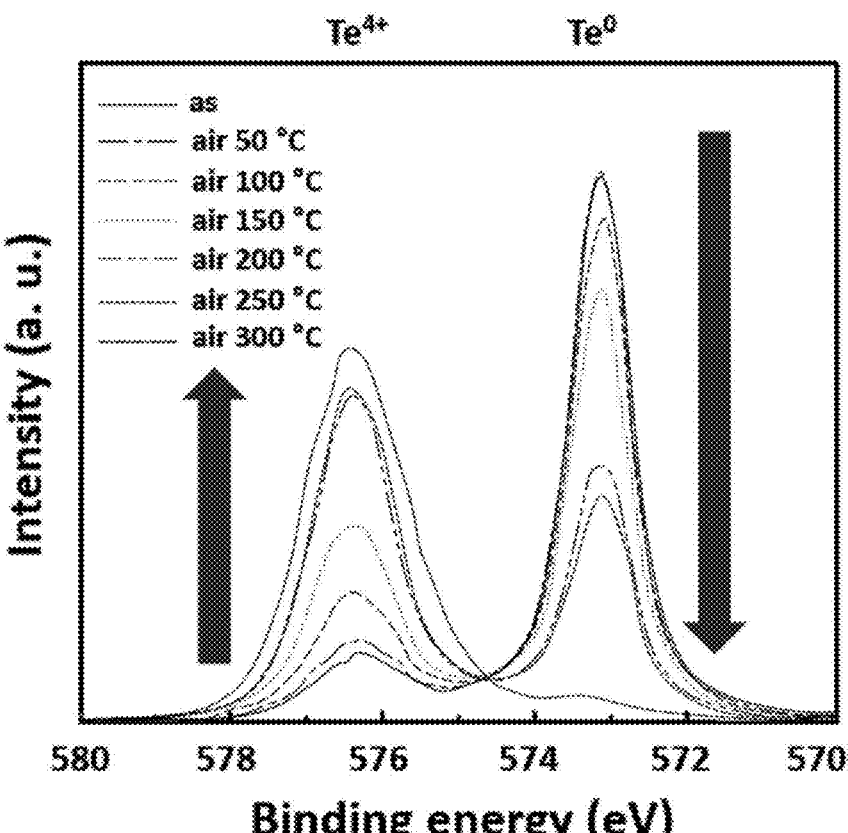
FIG. 2 is a Te $3d_{5/2}$ XPS graph for a $TeO_x$ pattern obtained during the manufacturing process of TFTs according to Preparation Examples 1 to 7.

FIG. 2 is a Te $3d_{5/2}$ XPS graph for a $TeO_x$ pattern obtained during the manufacturing process of TFTs according to Preparation Examples 1 to 7. The ratio of $Te^{4+}$ and metallic Te ($Te^0$) in the $TeO_x$ thin film described in Table 1 above was confirmed through deconvolution of peaks at 576.1±0.2 eV and 573.1±0.2 eV corresponding to $Te^{4+}$ and metallic Te ($Te^0$), respectively, in the results of XPS Te $3d_{5/2}$.

Referring to Tables 1 and FIG. 2, it can be seen that as the heat treatment temperature increases, the ratio of metallic Te ($Te^0$) decreases, and the ratio of $Te^{4+}$ increases. Specifically, in the case of heat treatment at 150° C. or less (Preparation Examples 1 to 4), it can be seen that the ratio of metallic Te ($Te^0$) was greater than that of $Te^{4+}$, but when heat treatment was performed at 200° C. or higher (Preparation Examples 5 to 7), it can be seen that the ratio of $Te^{4+}$ was greater than that of metallic Te ($Te^0$).

Figure 3:
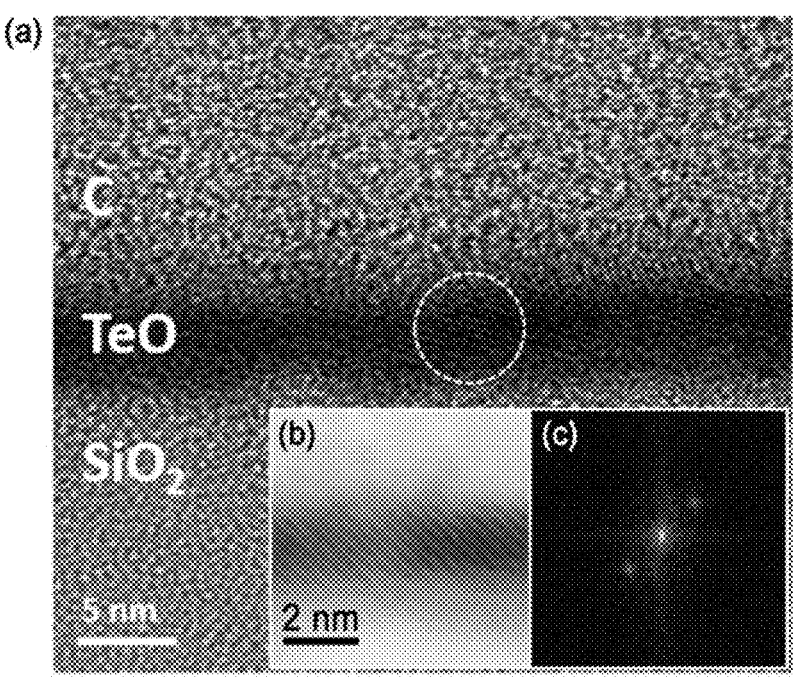
FIG. 3 shows a HR-TEM (High Resolution-Transmission Electron Microscope) image (a) of the $TeO_x$ pattern in the TFT according to Preparation Example 4, a screening TEM image (b) of the marked area of the HR-TEM image, and a SAED (selected area electron diffraction) pattern (c) of the marked area.

FIG. 3 shows a HR-TEM (High Resolution-Transmission Electron Microscope) image (a) of the $TeO_x$ pattern in the TFT according to Preparation Example 4, a screening TEM image (b) of the marked area of the HR-TEM image, and a SAED (selected area electron diffraction) pattern (c) of the marked area.

Referring to FIG. 3, it can be seen that the $TeO_x$ pattern heat-treated at 150 degrees shows crystalline, specifically polycrystalline.

In addition, the $TeO_x$ pattern of the TFT according to Preparation Example 5 heat-treated at 200 degrees also exhibited similar crystallinity.

Figure 4A:
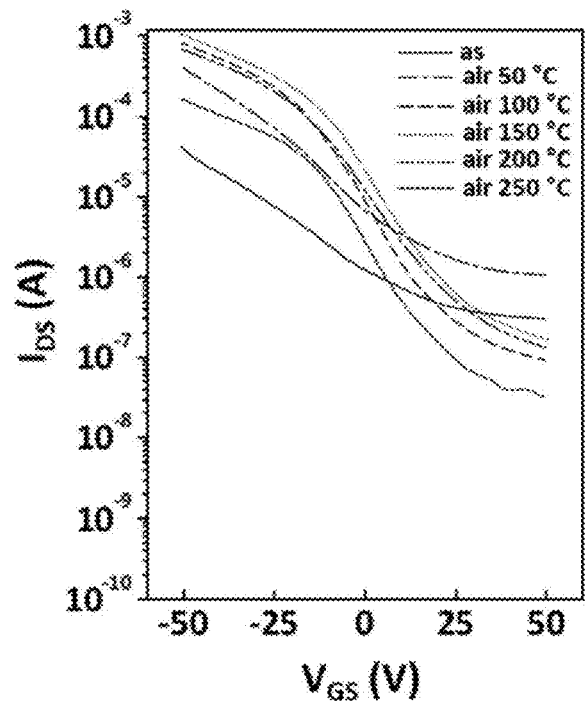
FIG. 4A is a graph showing the transmission characteristics of the TFTs according to Preparation Examples 1 to 6.
Figures 4B, 5A:
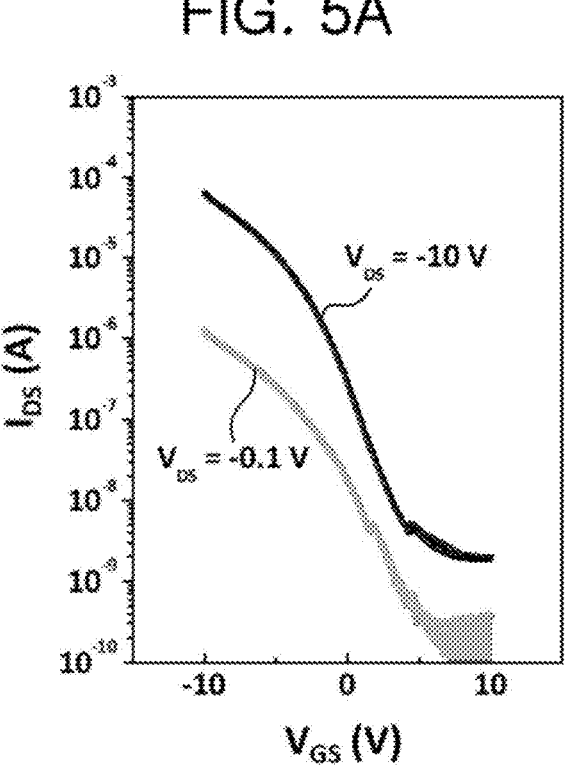
FIG. 4B is a graph showing the output characteristics of the TFT according to Preparation Example 4.
FIGS. 5A and 5B are graphs showing transfer characteristics and output characteristics of a TFT according to Preparation Example 8, respectively.

FIG. 4A is a graph showing the transmission characteristics of the TFTs according to Preparation Examples 1 to 6, and FIG. 4B is a graph showing the output characteristics of the TFTs according to Preparation Example 4. In measuring the transfer characteristics of the TFT, the applied voltage between the drain-source electrode ($V_{DS}$) is –0.1 and –10 V. The TFT mobility and on/off ratio according to the composition are shown in Table 1.

Referring to FIGS. 4A and 4B, TFT including a $TeO_x$ pattern that has not been subjected to heat treatment (Preparation Example 1), and TFTs each including a $TeO_x$ pattern heat treated at 50 to 250 degrees (Preparation Examples 2 to 6) are all turned on when a negative voltage is applied to the gate electrode, so it can be seen that all of the TFTs exhibit the p-type TFT characteristics.

However, the TFT including the $TeO_x$ pattern that was not subjected to heat treatment (Preparation Example 1) and the TFT including the $TeO_x$ pattern heat treated at 50 degrees (Preparation Example 2) showed a low on/off ratio. And, the TFT (Preparation Example 6) including the $TeO_x$ pattern heat-treated at 250 degrees showed somewhat inferior reproducibility, which was estimated to be due to the volatilization of Te during the heat treatment process as described with reference to Table 1.

Meanwhile, the TFT including the $TeO_x$ pattern heat-treated at 150 degrees showed excellent output characteristics.

Preparation Example 8

A TFT was manufactured in the same manner as in Preparation Example 4, except that a 30 nm $Al_2O_3$ layer was formed as a gate insulating film on the p-type Si wafer, which is the gate electrode, instead of the 100 nm $SiO_2$ layer.

Figure 5B:
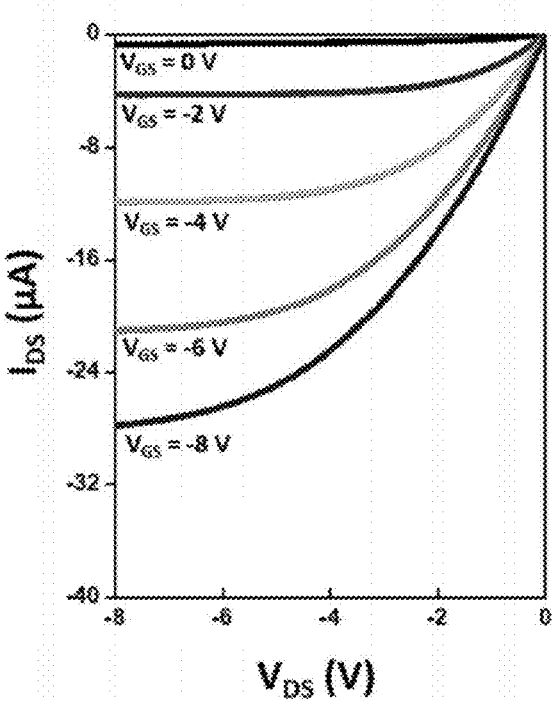

FIGS. 5A and 5B are graphs showing transfer characteristics and output characteristics of a TFT according to Preparation Example 8, respectively.

Referring to FIGS. 5A and 5B, the TFT according to Preparation Example 4 (FIG. 4, air 150° C.) using a $SiO_2$ film as a gate insulating film shows a driving voltage of about 50 V, whereas the TFT according to Preparation Example 8 using an $Al_2O_3$ film as a gate insulating film shows a driving voltage of about 10 V. From this, it can be seen that the driving voltage decreases as a high-k insulating layer ($Al_2O_3$) is used as a gate insulating layer in a thin film transistor including $TeO_X$ as a channel layer.

Preparation Example 9

A passivation layer of 10 nm $Al_2O_3$ layer was formed at 150° C. using an atomic layer deposition method on the $TeO_X$ pattern exposed between the source/drain electrodes of the thin film transistor according to Preparation Example 4, in which the $TeO_X$ layer was heat-treated at 150° C. for 1 hour in an atmospheric atmosphere after forming the source/drain electrodes.

Preparation Example 10

A passivation layer of 10 nm $Al_2O_3$ layer was formed at 150° C. using an atomic layer deposition method on the $TeO_X$ pattern exposed between the source/drain electrodes of the thin film transistor according to Preparation Example 5, in which the $TeO_X$ layer was heat-treated at 200° C. for 1 hour in an atmospheric atmosphere after forming the source/drain electrodes.

Figure 6:
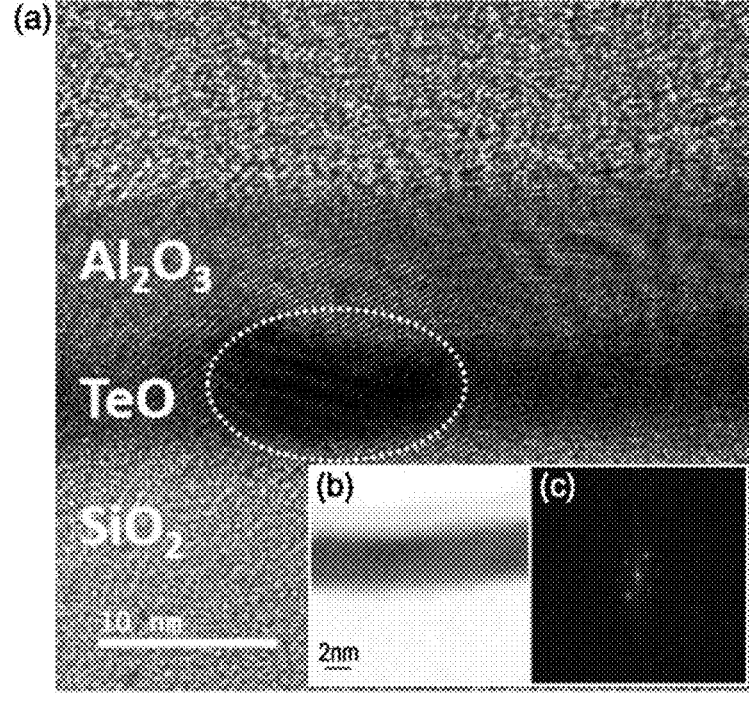
FIG. 6 shows a HR-TEM (High Resolution-Transmission Electron Microscope) image (a) of the $TeO_x$ pattern in the TFT according to Preparation Example 9, a screening TEM image (b) of the marked area of the HR-TEM image, and a SAED (selected area electron diffraction) pattern (c) of the marked area.

FIG. 6 shows a HR-TEM (High Resolution-Transmission Electron Microscope) image (a) of the $TeO_x$ pattern in the TFT according to Preparation Example 9, a screening TEM image (b) of the marked area of the HR-TEM image, and a SAED (selected area electron diffraction) pattern (c) of the marked area.

Referring to FIG. 6, it can be seen that the $TeO_x$ thin film passivated with the $Al_2O_3$ layer exhibits clear crystallinity compared to the non-passivated $TeO_x$ thin film of the TFT according to Preparation Example 4 (FIG. 3), and crystal grains are also formed. This improvement in crystallinity was presumed to be because Al was doped into the $TeO_x$ thin film in contact with the $Al_2O_3$ passivation layer while the $Al_2O_3$ passivation layer was formed at a temperature of about 150° C.

The $TeO_x$ thin film of TFT according to Preparation Example 10, which was heat-treated at 200° C., also showed results similar to those of FIG. 6.

Figure 7A:
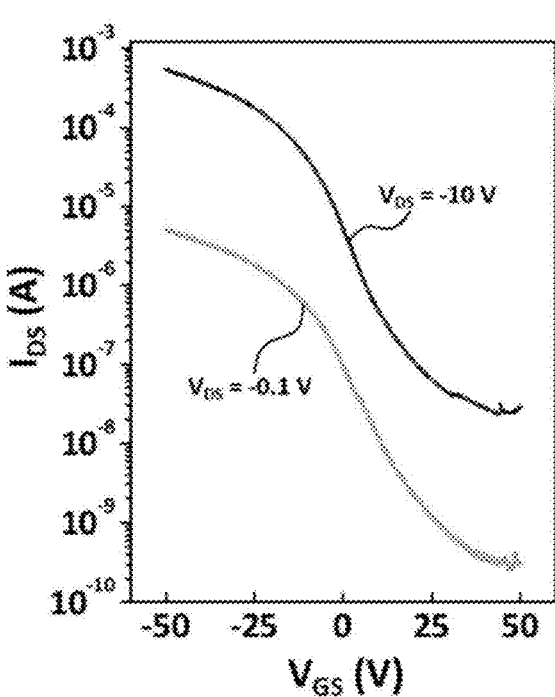
FIGS. 7A and 7B are graphs showing transfer characteristics and output characteristics of a TFT according to Preparation Example 9, respectively.
Figure 7B:
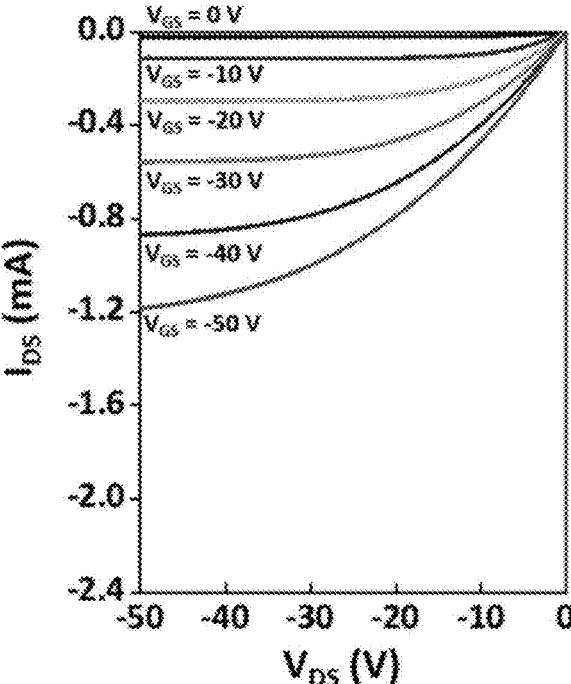

FIGS. 7A and 7B are graphs showing transfer characteristics and output characteristics of a TFT according to Preparation Example 9, respectively.

Referring to FIGS. 7A and 7B, the TFT according to Preparation Example 9 includes a $TeO_x$ thin film passivated with an $Al_2O_3$ layer, and thus shows on/off current ratio improved by about 2.6 times and SS (Subthreshold swing) value improved by about 13 times compared to the TFT according to Preparation Example 4 having a non-passivated $TeO_x$ thin film (FIG. 4, air 150° C.).

While the exemplary embodiments of the present invention have been described above, those of ordinary skill in the art should understood that various changes, substitutions and alterations may be made herein without departing from the spirit and scope of the present invention as defined by the following claims.

The invention claimed is:

1. A thin film transistor comprising:
    a gate electrode;
    a tellurium oxide channel layer on or under the gate electrode, the tellurium oxide channel layer being an alloy in which tellurium oxide is doped with a metal having a positive oxidation number or a non-metal element having a negative oxidation number, wherein the tellurium oxide is a metal oxide including tellurium, a portion of the tellurium is in a $Te^0$ state having a zero oxidation number, and another portion of the tellurium is in a Te4+ state having a tetravalent oxidation number;
    a gate insulating layer between the gate electrode and the tellurium oxide channel layer; and
    a source electrode and a drain electrode electrically connected to both ends of the tellurium oxide channel layer, respectively.

2. The thin film transistor of claim 1, wherein the $Te^0$ state is contained in an amount of 30 to 90%, and the $Te^{4+}$ state is contained in an amount of 10 to 70% in the tellurium oxide.

3. The thin film transistor of claim 1, wherein a content of the $Te^0$ state is greater than that of the $Te^{4+}$ state in the tellurium oxide.

4. The thin film transistor of claim 1, wherein the tellurium oxide is crystalline.

5. The thin film transistor of claim 1, wherein the tellurium oxide is polycrystalline.

6. The thin film transistor of claim 1, wherein the tellurium oxide is a p-type semiconductor.

7. The thin film transistor of claim 1, wherein an energy level of a valence band maximum of the tellurium oxide is composed of Te 5p orbital.

8. The thin film transistor of claim 1, wherein the tellurium oxide is represented by the following Formula I:

$$Te_{1-a}M_aO_{x-b}A_b \qquad \text{[Formula I]}$$

In Formula 1, x is greater than 0 and less than 2, M is a metal having a positive oxidation number, $0 \leq a \leq 0.5$, A is an element having a negative oxidation number, and $0 \leq b \leq 1$.

9. The thin film transistor of claim 8, wherein x is between 0.2 and 1.2.

10. The thin film transistor of claim 1, wherein the gate insulating layer is a high-k insulating layer having a higher dielectric constant than that of a silicon oxide layer.

11. The thin film transistor of claim 1, further comprising:
a passivation layer between the source electrode and the drain electrode and covering a surface of the tellurium oxide channel layer exposed between the source electrode and the drain electrode.

12. The thin film transistor of claim 11, wherein the passivation layer is an $Al_2O_3$ layer.

13. The thin film transistor of claim 1, further comprising:
a first interfacial layer between the tellurium oxide channel layer and the gate insulating layer for alleviating Fermi-level pinning between the tellurium oxide channel layer and the gate insulating layer and/or a second interfacial layer between the tellurium oxide channel layer and the source electrode and between the tellurium oxide channel layer and the drain electrode for alleviating Fermi-level pinning between the tellurium oxide channel layer and each of the source electrode and the drain electrode.

14. A method for manufacturing a thin film transistor of claim 1 comprising:
depositing a tellurium oxide layer on a substrate;
heat treating the tellurium oxide layer to form the tellurium oxide channel layer in which a part of Te is in the $Te^0$ state having a zero oxidation number, and another part of Te is in the $Te^{4+}$ state having a tetravalent oxidation number.

15. The method of claim 14, wherein, in the heat treating, a content of the $Te^0$ state decreases and a content the $Te^{4+}$ state increases in the tellurium oxide layer.

16. The method of claim 14, further comprising:
after the heat treating forming a passivation layer to cover a surface of the tellurium oxide layer.

17. The method of claim 16, wherein the passivation layer is a metal oxide insulating layer or a metal layer.

18. The method of claim 16, wherein the passivation layer is an $Al_2O_3$ layer.

19. A thin film transistor comprising:
a gate electrode;
a tellurium oxide channel layer containing tellurium oxide and being on or under the gate electrode, wherein the tellurium oxide is a metal oxide including tellurium, a portion of the tellurium is in a Te0 state having a zero oxidation number, and another portion of the tellurium is in a Te4+ state having a tetravalent oxidation number;
a gate insulating layer disposed between the gate electrode and the tellurium oxide channel layer; and
a source electrode and a drain electrode electrically connected to both ends of the tellurium oxide channel layer, respectively,
wherein the tellurium oxide is one of crystalline or polycrystalline.

* * * * *